United States Patent
Park et al.

(10) Patent No.: US 10,340,402 B2
(45) Date of Patent: Jul. 2, 2019

(54) METHOD OF PREPARING METAL CHALCOGENIDE NANOPARTICLES AND METHOD OF PRODUCING LIGHT ABSORPTION LAYER THIN FILM BASED THEREON

(71) Applicant: LG CHEM, LTD., Seoul (KR)

(72) Inventors: Eun Ju Park, Daejeon (KR); Seokhee Yoon, Daejeon (KR); Seokhyun Yoon, Daejeon (KR); Hosub Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/508,825

(22) PCT Filed: Oct. 27, 2015

(86) PCT No.: PCT/KR2015/011356
§ 371 (c)(1),
(2) Date: Mar. 3, 2017

(87) PCT Pub. No.: WO2016/076550
PCT Pub. Date: May 19, 2016

(65) Prior Publication Data
US 2017/0288075 A1    Oct. 5, 2017

(30) Foreign Application Priority Data
Nov. 13, 2014  (KR) .......................... 10-2014-0157951

(51) Int. Cl.
*H01L 21/00* (2006.01)
*H01L 31/032* (2006.01)
(Continued)

(52) U.S. Cl.
CPC ............ *H01L 31/0324* (2013.01); *C01G 9/08* (2013.01); *C01G 19/006* (2013.01); *C09D 11/52* (2013.01);
(Continued)

(58) Field of Classification Search
CPC ......... H01L 21/02491; H01L 21/02557; H01L 31/022425; H01L 21/0256;
(Continued)

(56) References Cited

U.S. PATENT DOCUMENTS 7,964,481 B2   6/2011  Mitzi et al.
9,112,094 B2   8/2015  Johnson et al.
(Continued)

FOREIGN PATENT DOCUMENTS

CN    101000865 A    7/2007
CN    100570821 C    12/2009
(Continued)

OTHER PUBLICATIONS

Wen Li et al., "Cu2ZnSnS4 alloys synthesized from Cu2SnS3@ZnS nanoparticles via a facile hydrothermal apporach," Materials Letters 125 (2014) 167-170.
(Continued)

*Primary Examiner* — Brook Kebede
(74) *Attorney, Agent, or Firm* — Dentons US LLP

(57) ABSTRACT

Disclosed are a single-source precursor for synthesizing metal chalcogenide nanoparticles for producing a light absorption layer of solar cells comprising a Group VI element linked as a ligand to any one metal selected from the group consisting of copper (Cu), zinc (Zn) and tin (Sn), metal chalcogenide nanoparticles produced by heat-treating at least one type of the single-source precursor, a method of preparing the same, a thin film produced using the same and a method of producing the thin film.

5 Claims, 16 Drawing Sheets

(51) Int. Cl.
  C01G 9/08 (2006.01)
  C01G 19/00 (2006.01)
  C09D 11/52 (2014.01)
  H01L 31/0224 (2006.01)
  H01L 31/18 (2006.01)

(52) U.S. Cl.
  CPC .. H01L 31/022425 (2013.01); H01L 31/1864 (2013.01); *C01P 2002/72* (2013.01); *C01P 2002/74* (2013.01); *C01P 2002/85* (2013.01); *C01P 2004/03* (2013.01); *C01P 2004/04* (2013.01); *C01P 2004/62* (2013.01); *C01P 2004/64* (2013.01); *C01P 2004/84* (2013.01); *C01P 2006/40* (2013.01)

(58) Field of Classification Search
  CPC ......... H01L 21/02628; H01L 21/02568; H01L 31/0324; H01L 31/0326; H01L 31/1864; C01G 19/006; C01G 9/08; C09D 11/52
  USPC .......................................................... 438/95
  See application file for complete search history.

(56) References Cited

U.S. PATENT DOCUMENTS

| | | | |
|---|---|---|---|
| 2012/0055554 A1 | 3/2012 | Radu et al. | |
| 2012/0060928 A1 | 3/2012 | Johnson et al. | |
| 2012/0279420 A1* | 11/2012 | Liao ...................... | C09D 11/52 106/31.92 |
| 2012/0282730 A1* | 11/2012 | Liao ...................... | C09D 11/52 438/95 |
| 2014/0216555 A1 | 8/2014 | Aydil et al. | |

FOREIGN PATENT DOCUMENTS

| | | |
|---|---|---|
| CN | 101651171 A | 2/2010 |
| KR | 1020120030434 A | 3/2012 |
| WO | 2012100139 A2 | 7/2012 |

OTHER PUBLICATIONS

Ankur Khare et al., "Size control and quantum confinement in $Cu_2ZnSnS_4$ nanocrystals," Chem. Commun., 2011, 47, 11721-11723.

Michael Edler et al., "Copper zinc tin sulfide layers prepared from solution processable metal dithiocarbamate precursers," Material Chemistry and Physics 136 (2012) 582-588.

Manjiao Deng et al., "A generalized strategy for controlled synthesis of ternary metal sulfide nanocrystals," DOI: 10.1039/c3nj00928a, New Journal of Chemistry, Oct. 3, 2013 (online), vol. 38, pp. 77-83.

Adrian Ionut Cadis et al., "On the preparation of zinc sulphide powders from singlesource molecular precursors: Thermal descomposition of zinc diethyldithiocarbamate," Journal of Optoelectronics and Advanced Materials, Nov. 2011, vol. 13, pp. 1458-1461.

X.Z. Lin et al., "Correlation between processing conditons of $Cu_2ZnSn(S_xSe_{1-x})_4$ and modulated surface photovoltage," Applied Physics Letter 102, 143903 (2013), doi: 10.1063/1.4801463.

Qijie Guo et al., "A Simple Solution-based Route to High-Efficiency CZTSSe Thin-film Solar Cells," E.I. du Pont de Nemours and Company, 978-1-4673-066-7/12 IEEE 2011, pp. 2993-2996.

* cited by examiner

[FIG. 1]
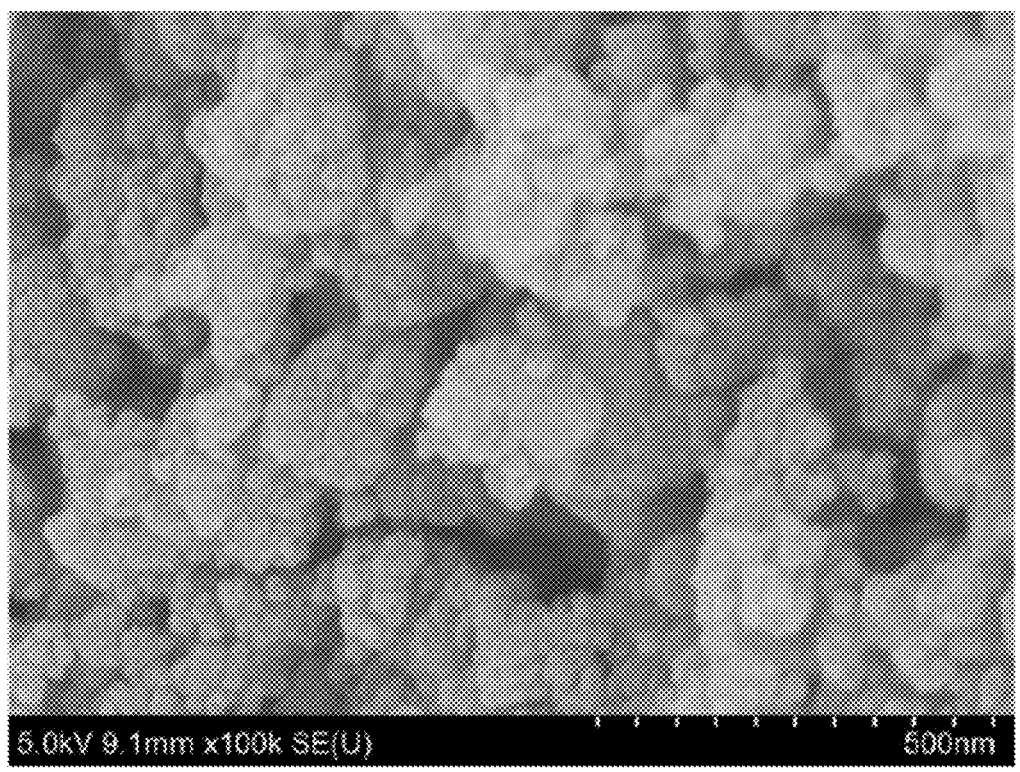

[FIG. 2]
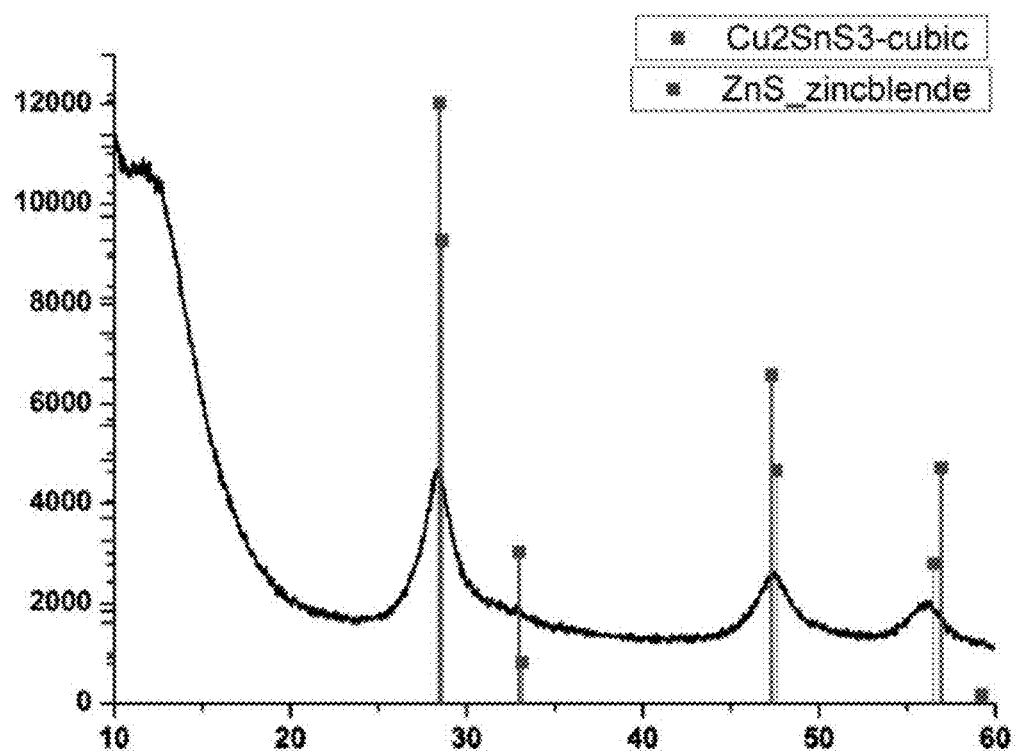

[FIG. 3]
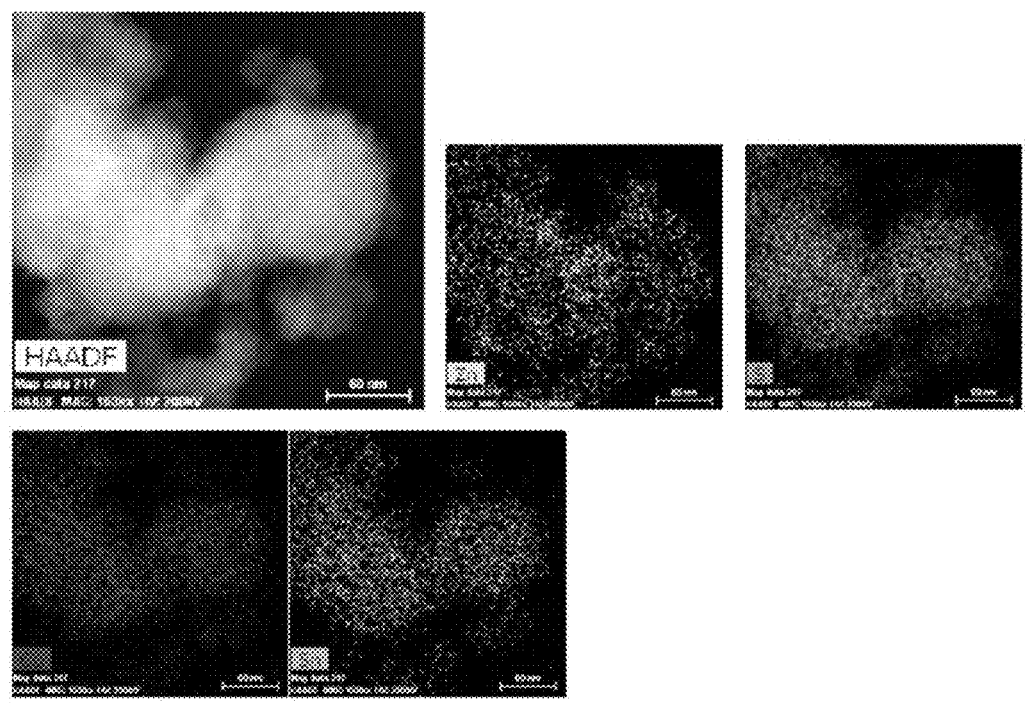

[FIG. 4]
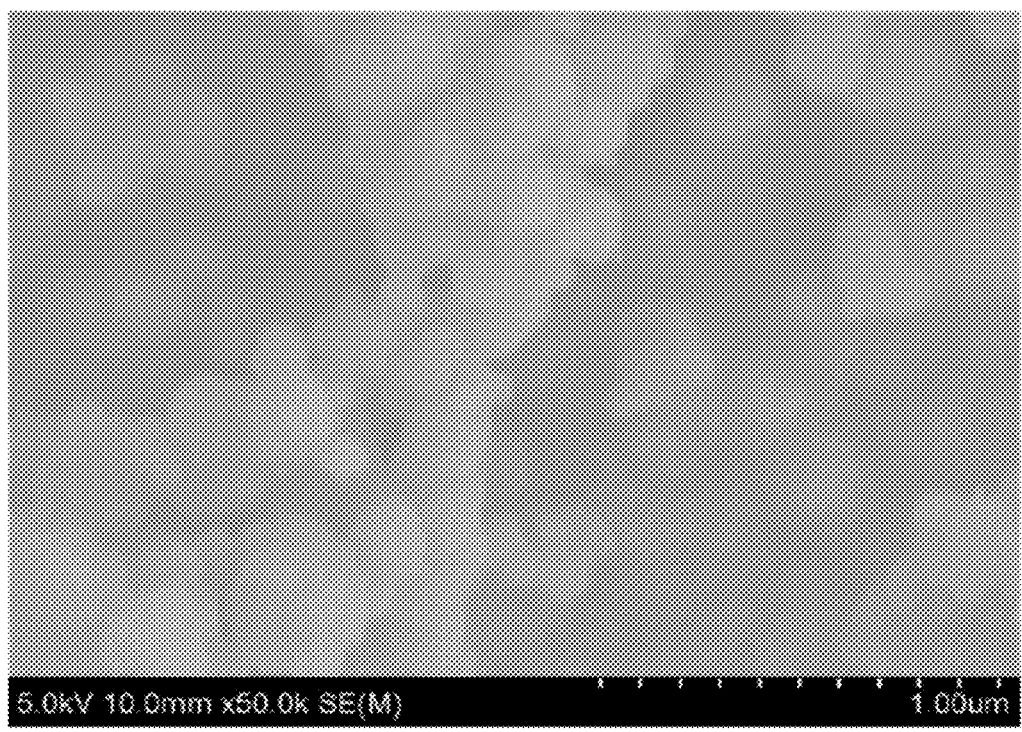

[FIG. 5]
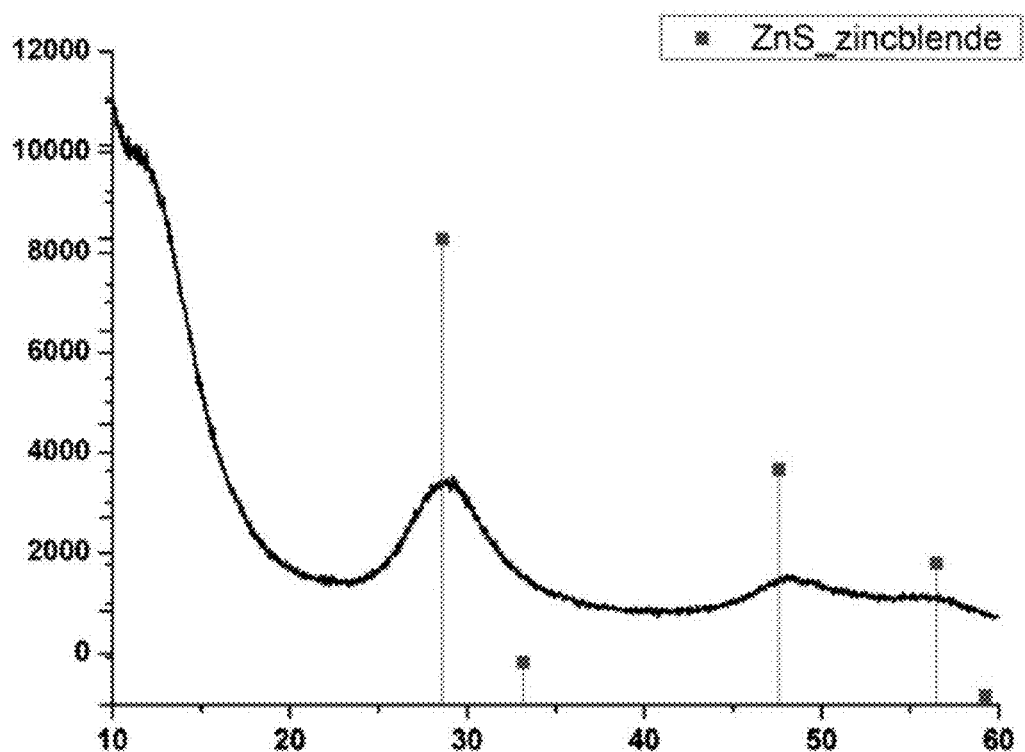

[FIG. 6]
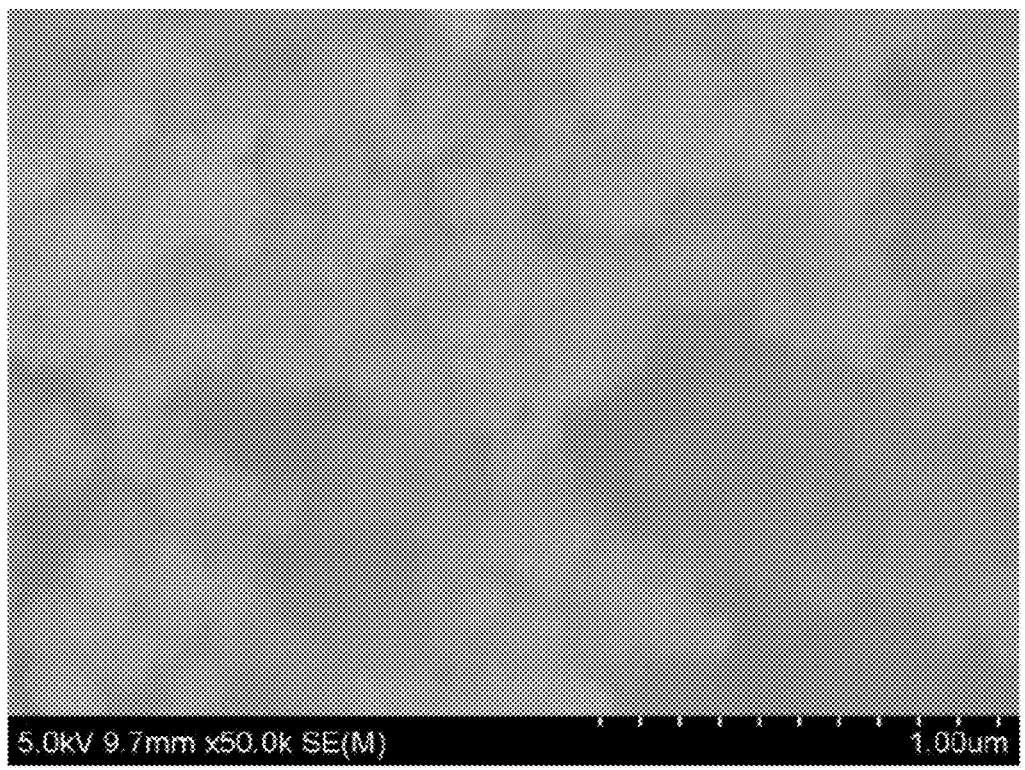

[FIG. 7]
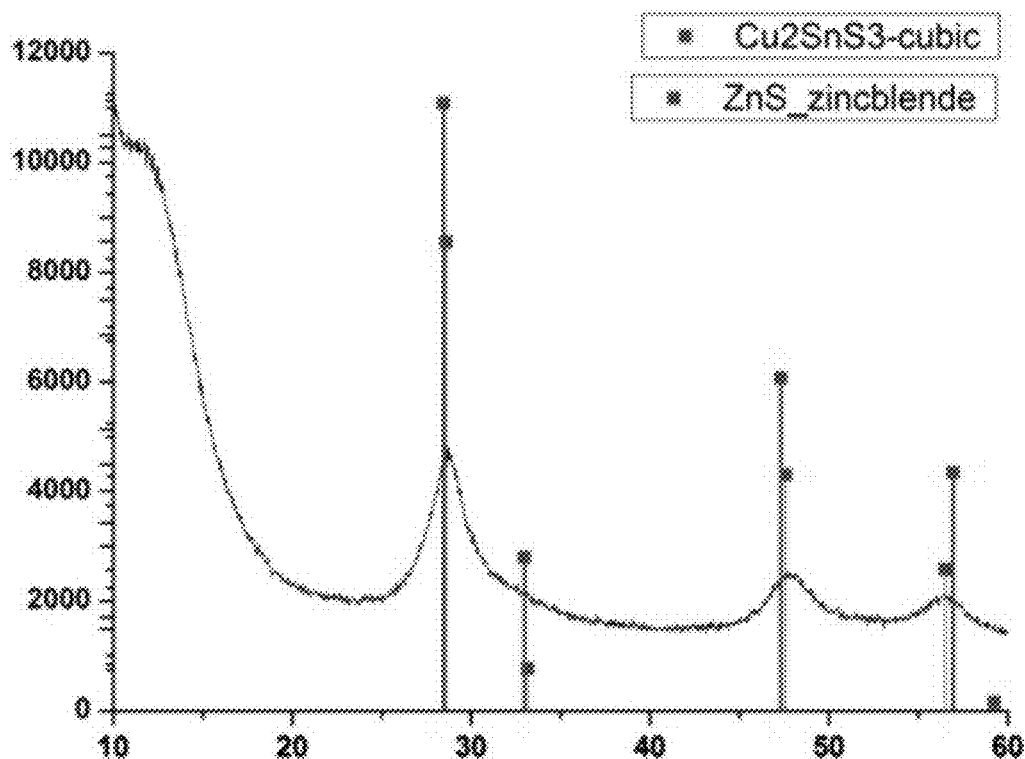
[FIG. 8]
| S K | 32.83 | 35.11 | 35.10 |
|---|---|---|---|
| Cu K | 31.57 | 29.54 | 32.18 |
| Zn K | 18.61 | 19.31 | 17.85 |
| Sn L | 17.00 | 16.04 | 14.87 |

[FIG. 9]
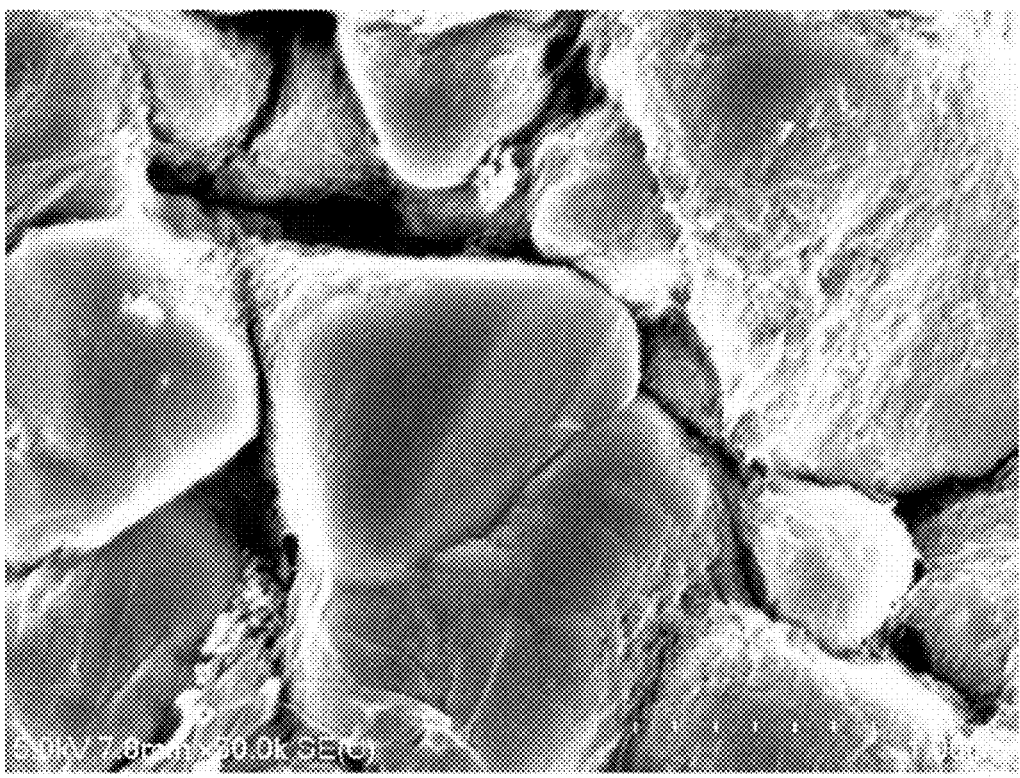

[FIG. 10]
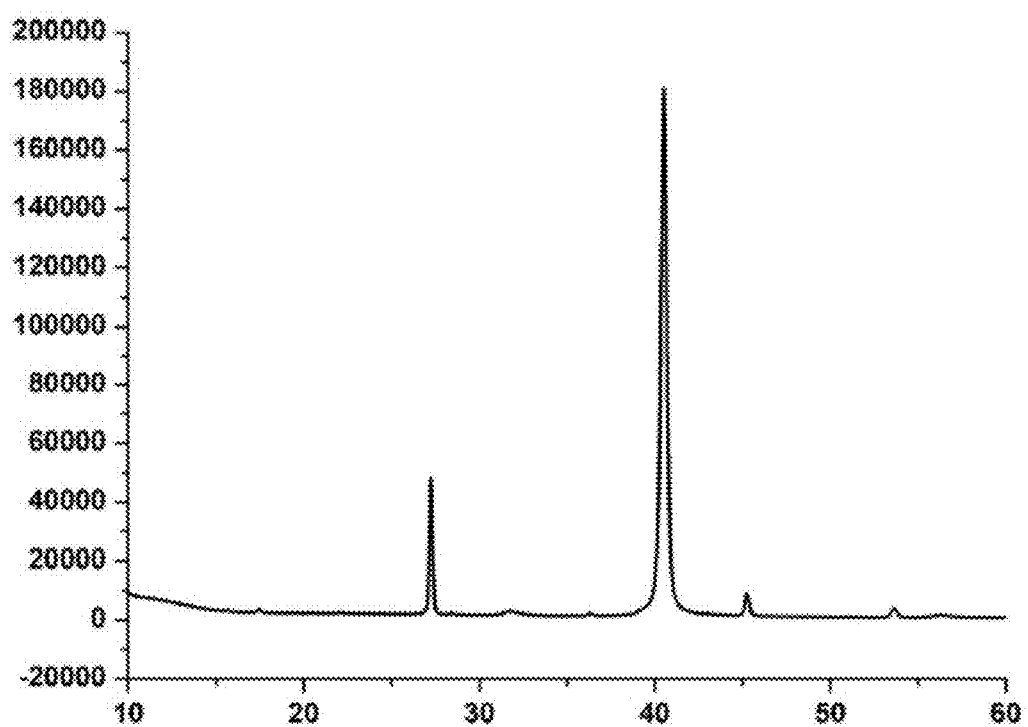

[FIG. 11]
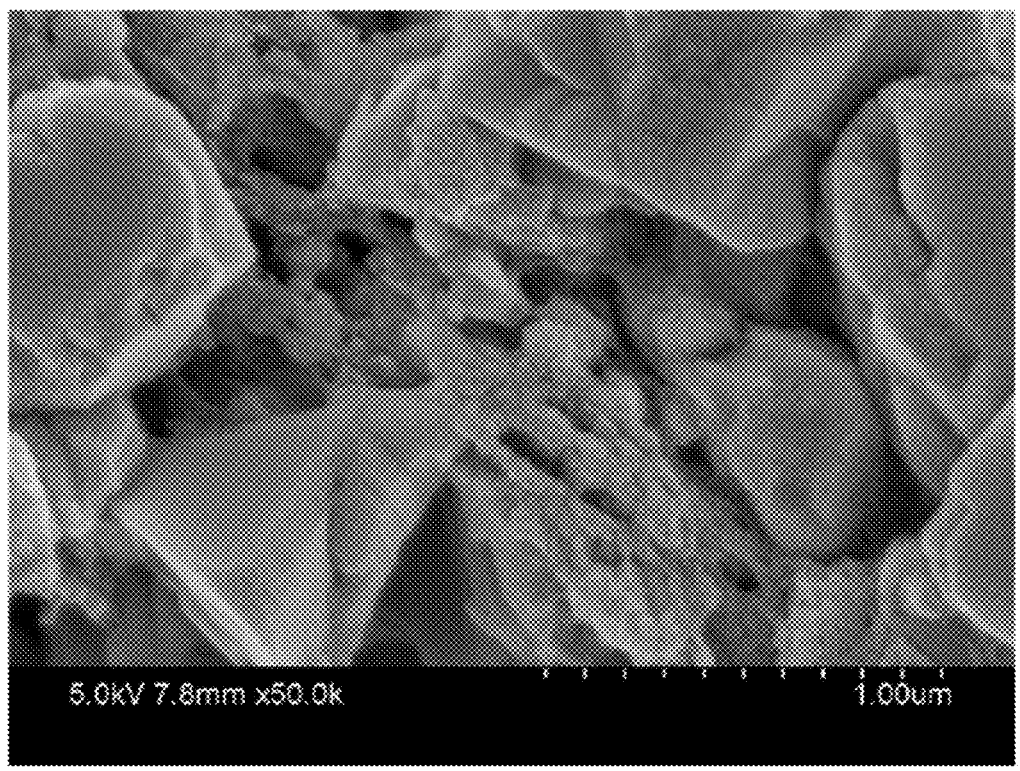

[FIG. 12]
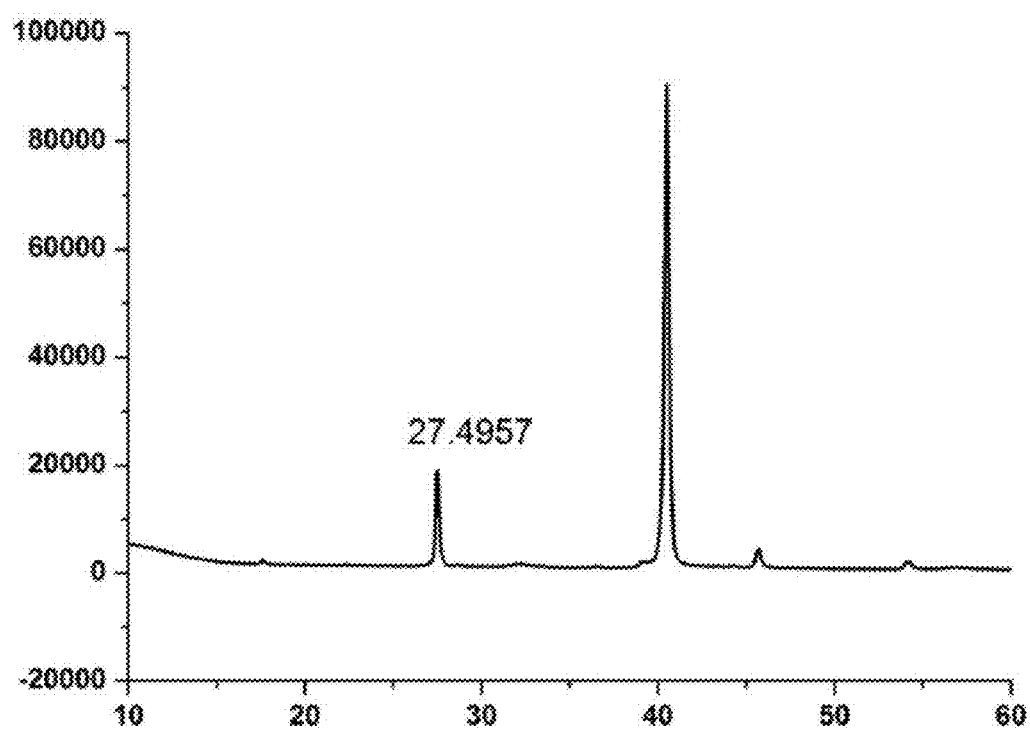

[FIG. 13]
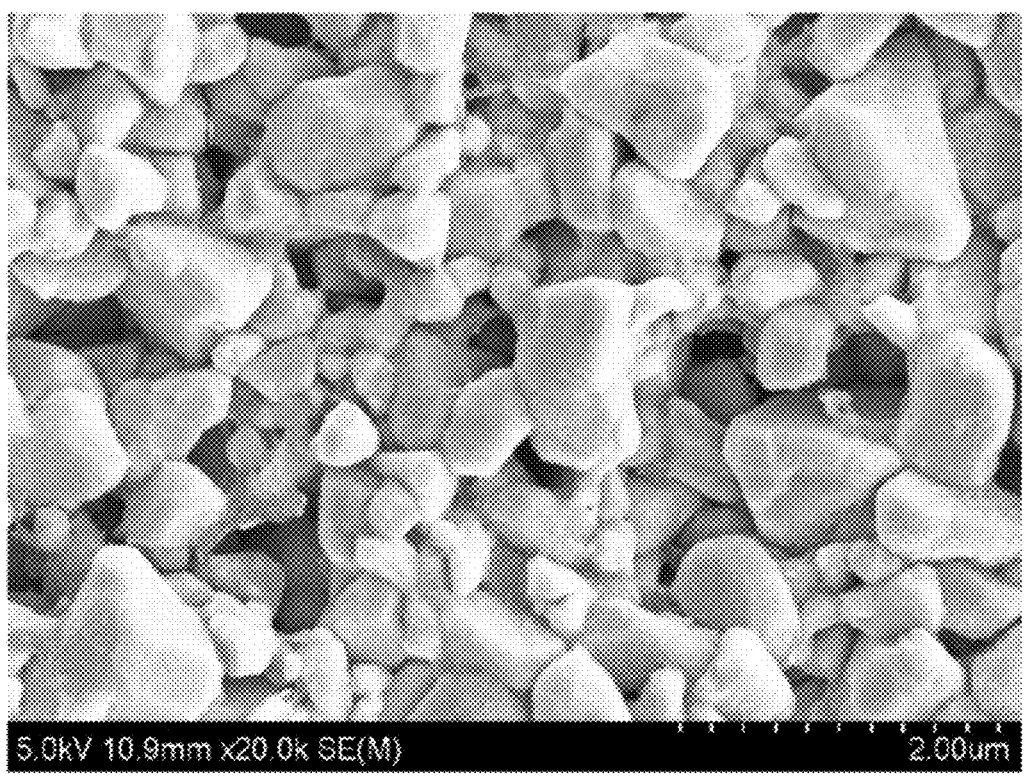

[FIG. 14]
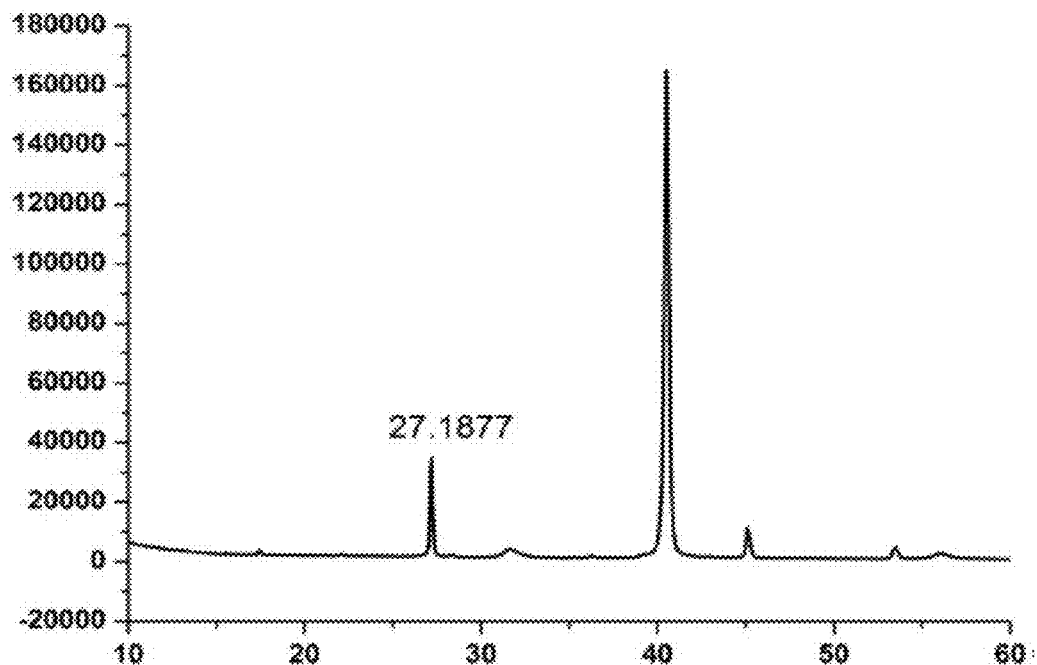
[FIG. 15]
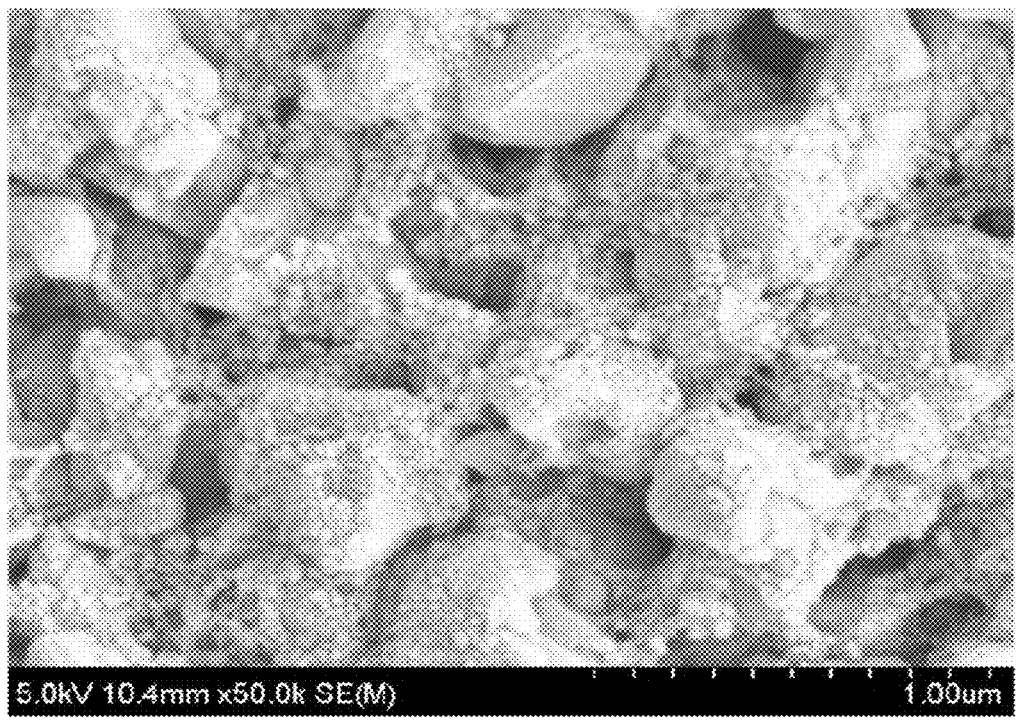

[FIG. 16]
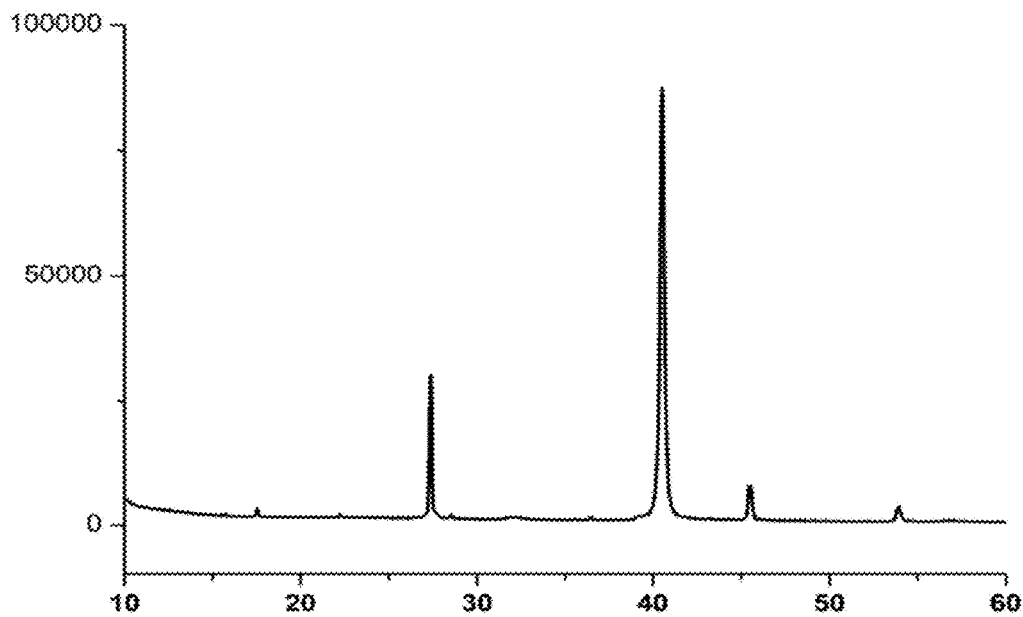
[FIG. 17]
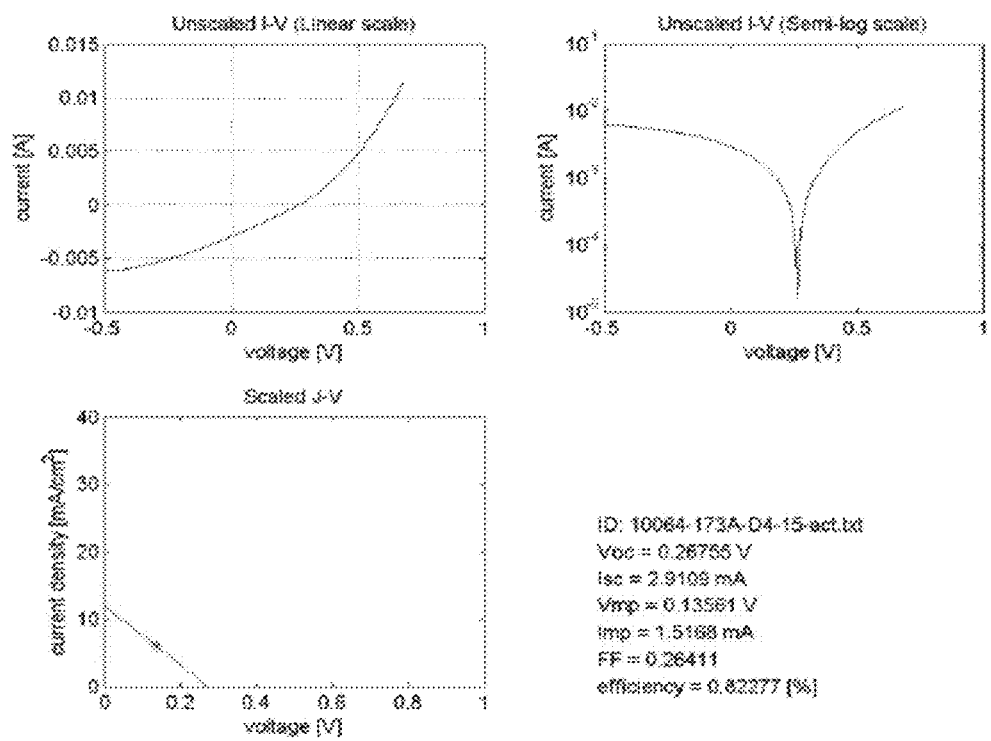

[FIG. 18]
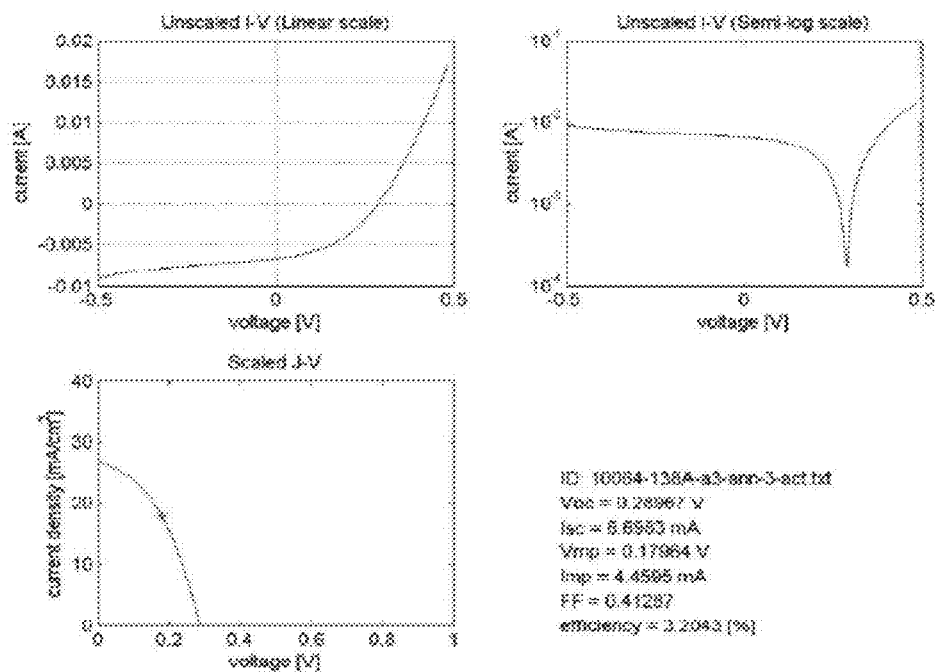
[FIG. 19]
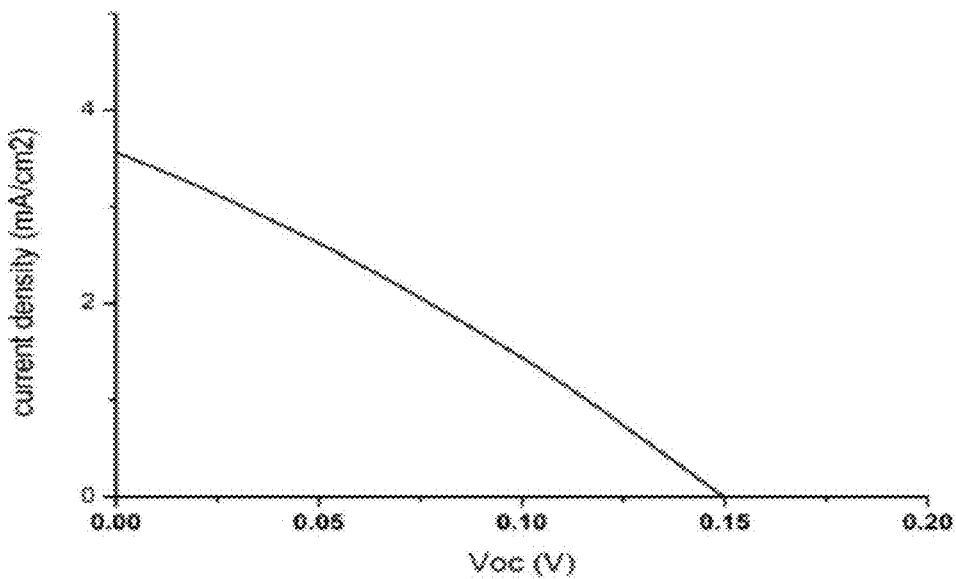

[FIG. 20]
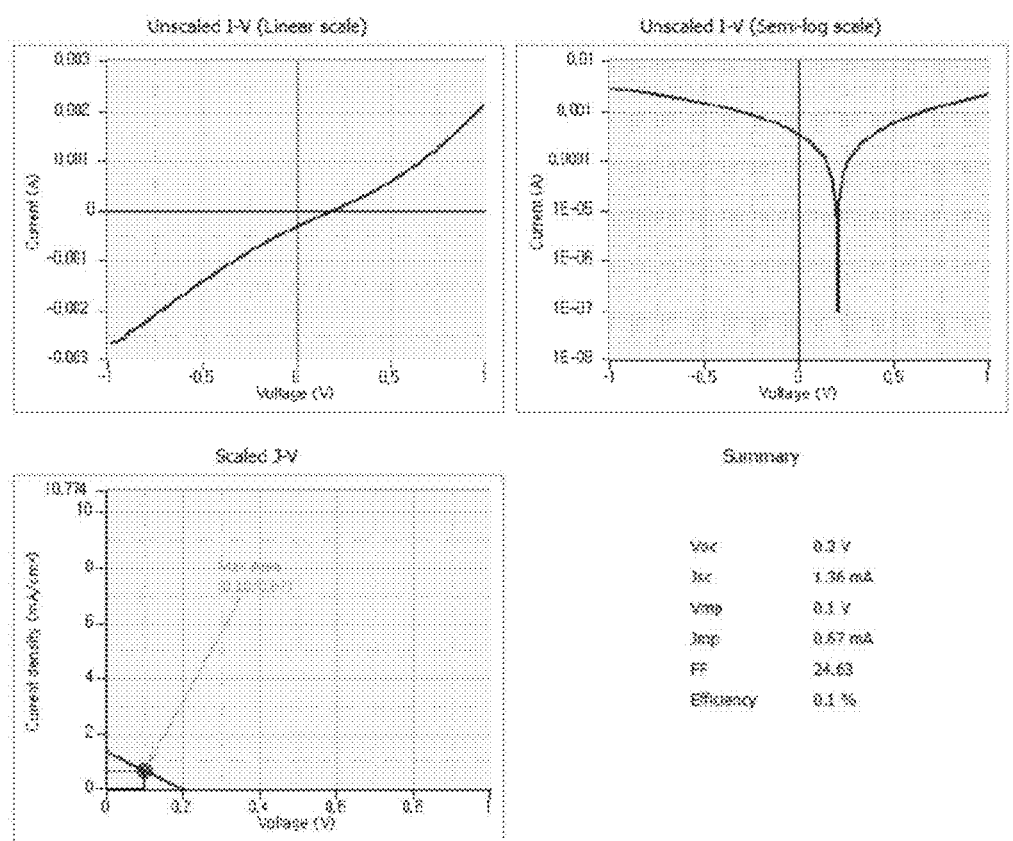

METHOD OF PREPARING METAL CHALCOGENIDE NANOPARTICLES AND METHOD OF PRODUCING LIGHT ABSORPTION LAYER THIN FILM BASED THEREON

CROSS-REFERENCE TO RELATED APPLICATION

This application is the National Stage entry of International Application No. PCT/KR2015/011356 filed Oct. 27, 2015 and claims priority to and the benefit of Korean Patent Application No. 10-2014-0157951 filed Nov. 13, 2014, which are contained in their entirety and incorporated herein by reference.

TECHNICAL FIELD

The present invention relates to metal chalcogenide nanoparticles for producing a CZTS-based solar cell light absorption layer, a method of preparing the same, a CZTS-based solar cell light absorption layer produced using the nanoparticles and a method of producing a solar cell.

BACKGROUND ART

Solar cells have been manufactured using a light absorption layer formed at high cost and silicon (Si) as a semiconductor material since an early stage of development. To more economically manufacture industrially applicable solar cells, structures of thin film solar cells, using an inexpensive light absorbing material such as copper indium gallium (di)selenide (CIGS) or Cu(In, Ga)(S, Se)$_2$, have been developed. Such CIGS-based solar cells typically include a rear electrode layer, an n-type junction part, and a p-type light absorption layer. Solar cells including such CIGS layers have a power conversion efficiency of greater than 19%. However, in spite of potential for CIGS-based thin film solar cells, costs and insufficient supply of indium (In) are main obstacles to wide applicability and availability of thin film solar cells using CIGS-based light absorption layers. Thus, there is an urgent need to develop solar cells using In-free or In-less low-cost universal elements.

Accordingly, as an alternative to the CIGS-based light absorption layer, CZTS(Cu$_2$ZnSn(S,Se)$_4$-based solar cells including copper (Cu), zinc (Zn), tin (Sn), sulfur (S), or selenium (Se), which is an extremely cheap element, have recently received much attention. Advantageously, CZTS has a direct band gap of about 1.0 eV to about 1.5 eV and an absorption coefficient of $10^4$ cm$^{-1}$ or more, reserves thereof are relatively high, and CZTS uses Sn and Zn, which are inexpensive.

CZTS hetero junction PV batteries were first reported in 1996, but CZTS-based solar cells are technologically less advanced than CIGS-based solar cells and photoelectric efficiency of CZTS-based solar cells is 10% or less which is much lower than that of CIGS-based solar cells. Thin films of CZTS are prepared by sputtering, hybrid sputtering, pulsed laser deposition, spray pyrolysis, electro-deposition/thermal sulfurization, e-beam processing, Cu/Zn/Sn/thermal sulfurization, and a sol-gel method.

Meanwhile, PCT/US/2010-035792 discloses formation of a thin film through heat-treatment of a substrate using ink including CZTS/Se nanoparticles. Generally, when a CZTS thin film is formed with CZTS/Se nanoparticles, it is difficult to enlarge crystal size in the subsequent process of forming a thin film due to previously formed small crystals. As such, when each grain is small, interfaces are extended, causing electron loss at interfaces. Accordingly, efficiency is inevitably deteriorated.

Accordingly, nanoparticles used in a thin film should include Cu, Zn and Sn, and should not be a CZTS crystal type. However, disadvantageously, in a case where only metal nanoparticles composed of a single metal element are used, the metal nanoparticles are easily oxidized and a subsequent additional process for removing oxygen using excess Se and high temperature is required.

Therefore, there is an increasing need for technologies associated with metal chalcogenide nanoparticles which maintain an overall homogenous metal composition and are produced by a simplified process.

DISCLOSURE

Technical Problem

Therefore, the present invention has been made to solve the above and other technical problems that have yet to be resolved.

As a result of a variety of extensive and intensive studies and experiments, the present inventors developed a single-source precursor including a Group VI element linked as a ligand to any one metal selected from the group consisting of copper (Cu), zinc (Zn) and tin (Sn), as a single-source precursor to synthesize metal chalcogenide nanoparticles for producing a light absorption layer of solar cells, and found that, in this case, metal chalcogenide nanoparticles which have an overall uniform composition and high economic efficiency can be produced without incorporating an additional Group VI element source. The present invention has been completed based on these findings.

Technical Solution

In accordance with one aspect of the present invention, provided is a single-source precursor for synthesizing metal chalcogenide nanoparticles for producing a light absorption layer of solar cells which includes a Group VI element linked as a ligand to any one metal selected from the group consisting of copper (Cu), zinc (Zn) and tin (Sn).

When the Group VI element is linked as a ligand to the metal described above, an additional Group VI element source is unnecessary, thus advantageously reducing process costs and simplifying the overall process.

The single-source precursor for synthesizing metal chalcogenide nanoparticles for producing a light absorption layer of solar cells according to the present invention is specifically a copper (Cu)-ligand complex, a tin (Sn)-ligand complex, or a zinc (Zn)-ligand complex.

In a specific embodiment, the ligand is not limited so long as it is useful as a Group VI element source and for example includes one or more selected from the following compounds:

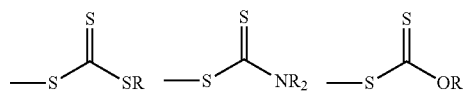

wherein R represents an alkyl group having n or more carbons (n≥1), for example, a methyl group, an ethyl group or a propyl group.

In the single-source precursor, the number of ligands bound to the metal is not particularly limited and may for example be 2 or 4, and the kind of ligand bound to one metal may be one or more.

The present invention provides metal chalcogenide nanoparticles produced by heat-treating one or more types of the single-source precursor.

Herein, "heat-treating one or more types of the single-source precursor" means that only one type of single-source precursors that can be variably prepared may be heat-treated or two or more types of the single-source precursors may be heat-treated, and "chalcogenide" means a substance containing a Group VI element, for example, sulfur (S) and/or selenium (Se).

Specifically, the metal chalcogenide nanoparticles can be prepared by heat-treating one type of the single-source precursor and the metal chalcogenide nanoparticles thus prepared may, for example, be copper (Cu)-containing chalcogenide nanoparticles, tin (Sn)-containing chalcogenide nanoparticles, or zinc (Zn)-containing chalcogenide nanoparticles.

Specifically, the copper (Cu)-containing chalcogenide nanoparticles may be CuS and/or CuSe, the tin (Sn)-containing chalcogenide nanoparticles may be SnS and/or SnSe, and the zinc (Zn)-containing chalcogenide nanoparticles may be ZnS and/or ZnSe.

In a specific embodiment, the metal chalcogenide nanoparticles can be prepared by heat-treating two types of single-source precursors and the metal chalcogenide nanoparticles thus prepared may, for example, be copper (Cu)-tin (Sn)-containing chalcogenide nanoparticles, copper (Cu)-zinc (Zn)-containing chalcogenide nanoparticles, or tin (Sn)-zinc (Zn)-containing chalcogenide nanoparticles.

Specifically, the copper (Cu)-tin (Sn)-containing chalcogenide nanoparticles may be $Cu_aSnS_b$ ($0.1 \leq a \leq 1.0$, $0.1 \leq b \leq 10.0$), and/or $Cu_sSnSe_t$ ($0.1 \leq s \leq 10.0$, $0.1 \leq t \leq 10.0$), the copper (Cu)-zinc (Zn)-containing chalcogenide nanoparticles may be $Cu_cZnS_d$ ($0.1 \leq c \leq 10.0$, $0.1 \leq d \leq 10.0$), and/or $Cu_uZnSe_v$ ($0.1 \leq u \leq 10.0$, $0.1 \leq v \leq 10.0$), or the tin (Sn)-zinc (Zn)-containing chalcogenide nanoparticles may be $Sn_eZnS_f$ ($0.1 \leq e \leq 10.0$, $0.1 \leq f \leq 10.0$) and/or $Sn_xZnSe_y$ ($0.1 \leq x \leq 10.0$, $0.1 \leq y \leq 10.0$).

In a specific embodiment, the metal chalcogenide nanoparticles can be prepared by heat-treating three types of single-source precursors and the metal chalcogenide nanoparticles thus prepared may, for example, be copper (Cu)-tin (Sn)-zinc (Zn)-containing chalcogenide nanoparticles.

Specifically, the copper (Cu)-tin (Sn)-zinc (Zn)-containing chalcogenide nanoparticles may be $Cu_gZn_hSnS_i$ ($1.0 \leq g \leq 10.0$, $0.5 \leq h \leq 3.0$, $0.1 \leq i \leq 10.0$,) and/or $Cu_pZn_qSnSe_r$ ($1.0 \leq p \leq 10.0$, $0.5 \leq q \leq 3.0$, $0.1 \leq r \leq 10.0$).

In addition, the metal chalcogenide nanoparticles according to the present invention may be composite nanoparticles including two or more chalcogenides.

In a specific embodiment, the composite nanoparticles including two chalcogenides may, for example, be composite nanoparticles composed of copper (Cu)-containing chalcogenide and tin (Sn)-containing chalcogenide, composite nanoparticles composed of copper (Cu)-containing chalcogenide and zinc (Zn)-containing chalcogenide, or composite nanoparticles composed of tin (Sn)-containing chalcogenide and zinc (Zn)-containing chalcogenide and may also be composite nanoparticles composed of copper (Cu)-tin (Sn)-containing chalcogenide and zinc (Zn)-containing chalcogenide, composite nanoparticles composed of copper (Cu)-zinc (Zn)-containing chalcogenide and tin (Sn)-containing chalcogenide, or composite nanoparticles composed of tin (Sn)-zinc (Zn)-containing chalcogenide and copper (Cu)-containing chalcogenide.

More preferably, the copper (Cu)-tin (Sn)-zinc (Zn)-containing chalcogenide nanoparticles or the composite nanoparticles including copper (Cu), tin (Sn) and zinc (Zn) according to the present invention do not require addition of an additional metal source and can thus exhibit improved uniformity because each nanoparticle includes all of copper (Cu), tin (Sn) and zinc (Zn).

In addition, the composite nanoparticles have a core-shell structure, in contrast to general nanoparticles. Specifically, the composite nanoparticles including copper (Cu)-containing chalcogenide and tin (Sn)-containing chalcogenide may be core-shell structured nanoparticles including a core including copper (Cu)-containing chalcogenide and a shell including tin (Sn)-containing chalcogenide, the composite nanoparticles including copper (Cu)-containing chalcogenide and zinc (Zn)-containing chalcogenide may be core-shell structured nanoparticles including a core including copper (Cu)-containing chalcogenide and a shell including zinc (Zn)-containing chalcogenide, the composite nanoparticles including tin (Sn)-containing chalcogenide and zinc (Zn)-containing chalcogenide may be core-shell structured nanoparticles including a core including tin (Sn)-containing chalcogenide and a shell including zinc (Zn)-containing chalcogenide, the composite nanoparticles including copper (Cu)-tin (Sn)-containing chalcogenide and zinc (Zn)-containing chalcogenide may be core-shell structured nanoparticles including a core including copper (Cu)-tin (Sn)-containing chalcogenide and a shell including zinc (Zn)-containing chalcogenide, the composite nanoparticles including copper (Cu)-zinc (Zn)-containing chalcogenide and tin (Sn)-containing chalcogenide may be core-shell structured nanoparticles including a core including copper (Cu)-zinc (Zn)-containing chalcogenide and a shell including tin (Sn)-containing chalcogenide, and the composite nanoparticles including tin (Sn)-zinc (Zn)-containing chalcogenide and copper (Cu)-containing chalcogenide may be core-shell structured nanoparticles including a core including tin (Sn)-zinc (Zn) chalcogenide and a shell including copper (Cu)-containing chalcogenide. In this case, the core-shell structured nanoparticles may have a particle diameter of 2 nanometers to 200 nanometers.

The core-shell structured nanoparticles are stable against oxidization so that formation of oxides can be minimized on grain surfaces and reactivity can thus be improved upon formation of thin films, because copper (Cu), tin (Sn) and zinc (Zn) metals are further homogeneously mixed and the core including respective particles is protected by the shell including metal-containing chalcogenide.

Meanwhile, methods of preparing the metal chalcogenide nanoparticles can be changed according to shape (structure) of the nanoparticles and the present invention provides methods of preparing metal chalcogenide nanoparticles depending on the structure thereof.

In an embodiment, the metal chalcogenide nanoparticles can be prepared by heat-treating a mixture including at least one type of single-source precursor including a Group VI element linked as a ligand to any one metal selected from the group consisting of copper (Cu), zinc (Zn) and tin (Sn).

By the method described above, copper (Cu)-containing chalcogenide nanoparticles, tin (Sn)-containing chalcogenide nanoparticles, or zinc (Zn)-containing chalcogenide nanoparticles, and copper (Cu)-tin (Sn)-containing chalcogenide nanoparticles, copper (Cu)-zinc (Zn)-containing chalcogenide nanoparticles, tin (Sn)-zinc (Zn)-containing chalcogenide nanoparticles, or copper (Cu)-tin (Sn)-zinc (Zn)-containing chalcogenide nanoparticles or the like can be prepared.

In another embodiment, a method of preparing the metal chalcogenide nanoparticles may include:

(a) heat-treating a mixture including at least one type of single-source precursor including a Group VI element linked as a ligand to any one metal selected from the group consisting of copper (Cu), zinc (Zn) and tin (Sn); and (b) adding, to the heat-treated mixture, a mixture including at least one type of single-source precursor including a Group VI element linked as a ligand to any one selected from metals, among the copper (Cu), zinc (Zn) and tin (Sn), not selected in step (a) and heat-treating the resulting mixture.

In addition, the method may further include, after step (b), adding a mixture including at least one type of single-source precursor including a Group VI element linked as a ligand to any one selected from metals, among the copper (Cu), zinc (Zn) and tin (Sn), not selected in steps (a) and (b), and heat-treating the resulting mixture.

By the method described above, composite nanoparticles including copper (Cu)-containing chalcogenide and tin (Sn)-containing chalcogenide, composite nanoparticles including copper (Cu)-containing chalcogenide and zinc (Zn)-containing chalcogenide, or composite nanoparticles including tin (Sn)-containing chalcogenide and zinc (Zn)-containing chalcogenide can be produced. In addition composite nanoparticles including copper (Cu)-tin (Sn)-containing chalcogenide and zinc (Zn)-containing chalcogenide, composite nanoparticles including copper (Cu)-zinc (Zn)-containing chalcogenide and tin (Sn)-containing chalcogenide, or composite nanoparticles including tin (Sn)-zinc (Zn)-containing chalcogenide and copper (Cu)-containing chalcogenide can be produced. In this case, the composite nanoparticles may be core-shell structured nanoparticles, as described above.

In the method of preparing metal chalcogenide nanoparticles, the heat-treatment is carried out at a temperature of 50 to 300° C. When heat-treatment is conducted at a temperature lower than 50° C., ligands cannot be sufficiently decomposed and it is difficult to synthesize the desired nanoparticles according to the present invention, and when heat-treatment is conducted at a temperature higher than 300° C., disadvantageously, desired nanoparticles are decomposed or other phases as well as desired nanoparticles may be formed.

The method of preparing metal chalcogenide nanoparticles according to the present invention involves simply heat-treating a single-source precursor including a Group VI element linked as a ligand to a metal, thus not requiring an additional Group VI element source, a capping agent, a reducing agent or the like to offer low process costs and a simple process.

In addition, the present invention provides an ink composition for preparing a light absorption layer including one or more types of the metal chalcogenide nanoparticles dispersed in a solvent and a method of producing a thin film using the metal chalcogenide nanoparticles.

As mentioned above, "Including one or more types of the metal chalcogenide nanoparticles according to the present invention" means including one or more of all types of metal chalcogenide nanoparticles that can be prepared according to the present invention.

In order to form a CZTS thin film of the present invention, the ink composition should include copper (Cu), zinc (Zn) and tin (Sn). Accordingly, the ink composition may, for example, be composed of a combination of at least one of copper (Cu), zinc (Zn) and tin (Sn), such as a combination of copper (Cu)-containing chalcogenide nanoparticles and tin (Sn)-zinc (Zn)-containing chalcogenide nanoparticles, a combination of copper (Cu)-tin (Sn)-containing chalcogenide nanoparticles and copper (Cu)-zinc (Zn)-containing chalcogenide nanoparticles, and a combination of copper (Cu)-tin (Sn)-zinc (Zn)-containing chalcogenide nanoparticles and copper (Cu)-tin (Sn)-containing chalcogenide nanoparticles.

In this case, the composition of metal chalcogenide nanoparticles included in the ink composition may be $Cu_jZn_kSn$ ($1.0 \leq j \leq 4.0$, $0.5 \leq k \leq 2.0$).

When the metal composition is not within the range, disadvantageously, secondary phases can be formed and solar cells cannot normally function because the composition does not fall into a general composition of CZTS.

In addition, the content of the Group VI element in metal chalcogenide nanoparticles included in the ink composition may be 0.5 to 4.0, with respect to 1 mole of the total metal amount.

When the ratio of the Group VI element is not within the range and is, for example, lower than 0.5 moles, sufficient Group VI elements cannot be supplied, films that are partially deficient in Group VI elements can be formed and the films may be oxidized, and the ratio exceeds 4.0 moles, thin films may non-uniformly grow due to non-uniform distribution of Group VI elements in the thin films and the Group VI source evaporates during heat treatment for producing thin films, disadvantageously causing excess pores to be created in final thin films.

Meanwhile, the method of producing a thin film using the metal chalcogenide nanoparticles according to the present invention includes:

(i) dispersing, in a solvent, one or more types of the metal chalcogenide nanoparticles according to the present invention to prepare an ink;

(ii) coating a substrate provided with an electrode with the ink; and (iii) drying the ink coated on the substrate provided with an electrode, and conducting heat treatment.

As such, when the thin film is produced using the metal chalcogenide nanoparticles according to the present invention, stable metal chalcogenide having no phase change can suppress formation of secondary phases in the thin film and provide an overall uniform composition of Cu, Zn and Sn.

In a specific embodiment, the solvent of step (i) may be used without particular limitation so long as it is a generally used organic solvent. The solvent may be an organic solvent selected from alkane, alkene, alkyne, aromatic, ketone, nitrile, ether, ester, organic halide, alcohol, amine, thiol, carboxylic acid, phosphine, phosphate, sulfoxide and amide, or a combination thereof.

Specifically, the alcohol solvent may be at least one mixed solvent selected from ethanol, 1-propanol, 2-propanol, 1-pentanol, 2-pentanol, 1-hexanol, 2-hexanol, 3-hexanol, heptanol, octanol, ethylene glycol (EG), diethylene glycol monoethyl ether (DEGMEE), ethylene glycol monomethyl ether (EGMME), ethylene glycol monoethyl ether (EGMEE), ethylene glycol dimethyl ether (EGDME), ethylene glycol diethyl ether (EGDEE), ethylene glycol monopropyl ether (EGMPE), ethylene glycol monobutyl ether (EGMBE), 2-methyl-1-propanol, cyclopentanol, cyclohexanol, propylene glycol propyl ether (PGPE), diethylene glycol dimethyl ether (DEGDME), 1,2-propanediol (1,2-PD), 1,3-propanediol (1,3-PD), 1,4-butanediol (1,4-BD), 1,3-butanediol (1,3-BD), α-terpineol, diethylene glycol (DEG), glycerol, 2-(ethylamino)ethanol, 2-(methylamino)ethanol, and 2-amino-2-methyl-1-propanol.

The amine solvent may be at least one mixed solvent selected from triethylamine, dibutyl amine, dipropyl amine, butylamine, ethanolamine, diethylenetriamine (DETA), triethylenetetramine (TETA), triethanolamine, 2-aminoethyl piperazine, 2-hydroxyethyl piperazine, dibutylamine, tris(2-aminoethyl)amine and hexylamine.

The thiol solvent may be at least one mixed solvent selected from 1,2-ethanedithiol, pentanethiol, hexanethiol, and mercaptoethanol.

The alkane solvent may be at least one mixed solvent selected from hexane, heptane and octane.

The aromatic solvent may be at least one mixed solvent selected from toluene, xylene, nitrobenzene and pyridine.

The organic halide solvent may be at least one mixed solvent selected from chloroform, methylene chloride, tetrachloromethane, dichloroethane, and chlorobenzene.

The nitrile solvent may be acetonitrile.

The ketone solvent may be at least one mixed solvent selected from acetone, cyclohexanone, cyclopentanone, and acetyl acetone.

The ether solvent may be at least one mixed solvent selected from ethyl ether, tetrahydrofuran and 1,4-dioxane.

The sulfoxide solvent may be at least one mixed solvent selected from dimethyl sulfoxide (DMSO), and sulfolane.

The amide solvent may be at least one mixed solvent selected from dimethyl formamide (DMF), and n-methyl-2-pyrrolidone (NMP).

The ester solvent may be at least one mixed solvent selected from ethyl lactate, γ-butyrolactone, and ethyl acetoacetate.

The carboxylic acid solvent may be at least one mixed solvent selected from propionic acid, hexanoic acid, meso-2,3-dimercaptosuccinic acid, thiolactic acid, and thioglycolic acid.

However, these solvents are given only as examples and the present invention is not limited thereto.

If necessary, an additive may be further added to prepare the ink in step (i).

The additive may, for example, include at least one selected from the group consisting of a dispersant, a surfactant, a polymer, a binder, a crosslinking agent, an emulsifying agent, an anti-foaming agent, a drying agent, a filler, a bulking agent, a thickening agent, a film conditioning agent, an antioxidant, a fluidizer, a leveling agent and a corrosion inhibitor. In particular, the additive may include at least one selected from the group consisting of polyvinylpyrrolidone (PVP), polyvinyl alcohol (PVA), Anti-terra 204, Anti-terra 205, ethyl cellulose, and DispersBYK110.

For example, the method of forming the coating layer of step (ii) may include one or more selected from the group consisting of wet coating, spray coating, spin-coating, doctor blade coating, contact printing, top feed reverse printing, bottom feed reverse printing, nozzle feed reverse printing, gravure printing, micro gravure printing, reverse micro gravure printing, roller coating, slot die coating, capillary coating, inkjet-printing, jet deposition, and spray deposition.

The heat-treatment of step (iii) may be carried out in the presence of S or Se. The method may optionally include selenization in order to prepare a solar cell thin film with a high density. The selenization may be carried out through a variety of methods.

In the first example, the selenization may be carried out by dispersing S and/or Se in the form of a particle in a solvent together with the metal chalcogenide nanoparticles of step (i) to prepare an ink and conducting the heat treatment of step (iii).

In the second example, the selenization may be carried out by conducting the heat treatment of step (iii) in the presence of S or Se. More specifically, the presence of S or Se can be achieved by supplying $H_2S$ or $H_2Se$ gas or supplying Se or S gas through heating.

In the third example, the selenization may be carried out by, after step (ii), depositing S or Se on a thin film.

In addition, the present invention provides a thin film produced by the method.

The thin film may have a thickness of 0.5 μm to 3.0 μm, more specifically, 0.5 μm to 2.5 μm.

When the thickness of the thin film is less than 0.5 μm, desired photoelectric efficiency cannot be obtained due to insufficient density and amount of the light absorption layer, and when the thickness of the thin film exceeds 3.0 μm, as movement distances of carriers increase, a possibility of leading to recombination is increased and deterioration in efficiency thus occurs.

Furthermore, the present invention provides a thin film solar cell produced using the thin film.

A method of producing the thin film solar cell is well-known to those skilled in the art and detailed explanation thereof is thus omitted.

BRIEF DESCRIPTION OF THE DRAWINGS

The above and other objects, features and other advantages of the present invention will be more clearly understood from the following detailed description taken in conjunction with the accompanying drawings, in which:

FIG. 1 is an SEM image of metal chalcogenide nanoparticles according to Example 1;

FIG. 2 is an XRD graph of metal chalcogenide nanoparticles according to Example 1;

FIG. 3 is an enlarged TEM image of metal chalcogenide nanoparticles according to Example 1;

FIG. 4 is an SEM image of metal chalcogenide nanoparticles according to Example 4;

FIG. 5 is an XRD graph of metal chalcogenide nanoparticles according to Example 4;

FIG. 6 is an SEM image of metal chalcogenide nanoparticles according to Example 6;

FIG. 7 is an XRD graph of metal chalcogenide nanoparticles according to Example 6;

FIG. 8 is an EDX analysis table of the metal chalcogenide nanoparticles according to Example 6;

FIG. 9 is an SEM image of a thin film produced in Example 7;

FIG. 10 is an XRD graph of the thin film produced in Example 7;

FIG. 11 is an SEM image of a thin film produced in Example 8;

FIG. 12 is an XRD graph of the thin film produced in Example 8;

FIG. 13 is an SEM image of a thin film produced in Example 9;

FIG. 14 is an XRD graph of the thin film produced in Example 9;

FIG. 15 is an SEM image of a thin film produced in Comparative Example 4;

FIG. 16 is an XRD graph of the thin film produced in Comparative Example 4;

FIG. 17 is an I-V graph of a solar cell produced from the thin film produced in Example 7;

FIG. 18 is an I-V graph of a solar cell produced from the thin film produced in Example 8;

FIG. 19 is an I-V graph of a solar cell produced from the thin film produced in Example 9; and FIG. 20 is an I-V graph of a solar cell produced from the thin film produced in Comparative Example 4.

BEST MODE

Now, the present invention will be described in more detail with reference to the following examples. These examples are provided only to illustrate the present invention and should not be construed as limiting the scope and spirit of the present invention.

EXAMPLE 1

Synthesis of Metal Chalcogenide Nanoparticles ($Cu_2SnS_3$/ZnS)

4 mmol of a $Cu(CS_2NEt_2)_2$ single source precursor and 2 mmol of a $Sn(CS_2NEt_2)_4$ single source precursor were mixed with 20 mL of oleic acid and 180 mL of 1-octadecene. The mixture was heated to 160° C. and reacted for 1 hour to prepare $Cu_2SnS_3$ nanoparticles.

A dispersion of the $Cu_2SnS_3$ nanoparticles was centrifuged and washed three times with 1-octadecene. The resulting substance was mixed with a $Zn(CS_2OEt)_2$ single source precursor, followed by heating to 120° C. and reacting for 1 hour to prepare metal chalcogenide nanoparticles including composite nanoparticles including a $Cu_2SnS_3$ phase and a ZnS phase, and $Cu_2SnS_3$—ZnS nanoparticles. The metal chalcogenide nanoparticles were purified by centrifugation.

The scanning electron microscope (SEM) image, XRD graph and transmission electron microscope (TEM) image of the formed metal chalcogenide nanoparticles are shown FIGS. 1 to 3.

As a result of XRD analysis, the particles are found to be present as a combination of a $Cu_2SnS_3$ crystal phase with a ZnS crystal phase, and as can be seen from FIG. 3, the particles are present as composite nanoparticles including uniformly distributed $Cu_2SnS_3$ and ZnS phases, or $Cu_2SnS_3$—ZnS structured nanoparticles.

EXAMPLE 2

Synthesis of Metal Chalcogenide Nanoparticles ($Cu_2SnS_3$/ZnS)

4 mmol of a $Cu(CS_2NEt_2)_2$ single source precursor and 2 mmol of a $Sn(CS_2NEt_2)_4$ single source precursor were mixed with 20 mL of oleic acid and 180 mL of 1-octadecene. The mixture was heated to 160° C. and reacted for 1 hour to prepare $Cu_2SnS_3$ nanoparticles.

A dispersion of the $Cu_2SnS_3$ nanoparticles was centrifuged and washed three times with 1-octadecene. The resulting substance was mixed with a $Zn(CS_2NEt_2)_2$ single source precursor, followed by heating to 120° C. and reacting for 1 hour to prepare metal chalcogenide nanoparticles including composite nanoparticles including a $Cu_2SnS_3$ phase and a ZnS phase, and $Cu_2SnS_3$—ZnS nanoparticles. The metal chalcogenide nanoparticles were purified by centrifugation.

EXAMPLE 3

Synthesis of Metal Chalcogenide Nanoparticles ($Cu_2SnS_3$)

4 mmol of a $Cu(CS_2NEt_2)_2$ single source precursor and 2 mmol of a $Sn(CS_2NEt_2)_4$ single source precursor were mixed with 20 mL of oleic acid and 180 mL of 1-octadecene. The mixture was heated to 160° C. and reacted for 1 hour to prepare $Cu_2SnS_3$ nanoparticles. The $Cu_2SnS_3$ nanoparticles were centrifuged.

EXAMPLE 4

Synthesis of Metal Chalcogenide Nanoparticles (ZnS)

4 mmol of a $Zn(CS_2NEt_2)_2$ single source precursor was mixed with 100 mL of xylene. The mixture was heated to 130° C. and reacted for 1 hour to prepare ZnS nanoparticles. The $Cu_2SnS_3$ nanoparticles were centrifuged.

The scanning electron microscope (SEM) image and XRD graph of the formed metal chalcogenide nanoparticles are shown in FIGS. 4 and 5.

EXAMPLE 5

Synthesis of Metal Chalcogenide Nanoparticles (ZnS)

4 mmol of a $Zn(CS_2OEt)_2$ single source precursor was mixed with 100 mL of xylene. The mixture was heated to 130° C. and reacted for 1 hour to prepare ZnS nanoparticles. The ZnS nanoparticles were centrifuged.

EXAMPLE 6

4 mmol of a $Cu(CS_2NEt_2)_2$ single source precursor, 2 mmol of a $Sn(CS_2NEt_2)_4$ single source precursor and 2.4 mmol of a $Zn(CS_2NEt_2)_2$ single source precursor were mixed with 20 mL of oleic acid and 180 mL of 1-octadecene. The mixture was heated to 160° C. and reacted for 1 hour to prepare metal chalcogenide nanoparticles including composite nanoparticles including a $Cu_2SnS_3$ phase and a ZnS phase, and $Cu_2SnS_3$—ZnS nanoparticles. The metal chalcogenide nanoparticles were purified by centrifugation.

The scanning electron microscope (SEM) image and XRD graph of the formed metal chalcogenide nanoparticles are shown in FIGS. 6 and 7.

As a result of XRD analysis, the particles are found to be present as a combination of a $Cu_2SnS_3$ crystal phase with a ZnS crystal phase, and as can be seen from FIG. 8, the $Cu_2SnS_3$ and ZnS phases are uniformly distributed.

COMPARATIVE EXAMPLE 1

Synthesis of ZnS Particles 5 mmol of zinc nitrate and 10 mmol of $Na_2S$ were dissolved in 50 ml of water, and the resulting aqueous zinc nitrate solution was added dropwise to the aqueous $Na_2S$ solution to synthesize ZnS. The formed particles were purified by centrifugation.

COMPARATIVE EXAMPLE 2

Synthesis of CuS Particles 5 mmol of copper nitrate and 10 mmol of $Na_2S$ were dissolved in 50 ml of water, and the resulting aqueous copper nitrate solution was added dropwise to the aqueous $Na_2S$ solution to synthesize CuS. The formed particles were purified by centrifugation.

COMPARATIVE EXAMPLE 3

Synthesis of SnS Particles 5 mmol of tin chloride and 10 mmol of $Na_2S$ were dissolved in 50 ml of water, and the resulting aqueous tin chloride solution was added dropwise to the aqueous Na$_2$S solution to synthesize SnS. The formed particles were purified by centrifugation.

EXAMPLE 7

Production of Thin Film

The Cu$_2$SnS$_3$—ZnS particles produced in Example 1 were dispersed in a mixed solvent containing an alcohol-based solvent to prepare an ink and the ink was coated on a glass substrate coated with molybdenum (Mo). After the coating film was dried, it was heated with a Se-deposited glass substrate to secure a Se atmosphere and rapid thermal annealing (RTA) was conducted at 575° C. to produce a CZTSSe-based thin film. The scanning electron microscope (SEM) image and XRD graph of the produced thin film are shown in FIGS. 9 and 10.

EXAMPLE 8

Production of Thin Film

The Cu$_2$SnS$_3$ produced in Example 3 and ZnS particles produced in Example 5 were dispersed in a mixed solvent containing an alcohol-based solvent to prepare an ink and the ink was coated on a glass substrate coated with molybdenum (Mo). After the coating film was dried, it was heated with a Se-deposited glass substrate to secure a Se atmosphere and rapid thermal annealing (RTA) was conducted at 575° C. to produce a CZTSSe-based thin film. The scanning electron microscope (SEM) image and XRD graph of the produced thin film are shown in FIGS. 11 and 12.

EXAMPLE 9

Production of Thin Film

The Cu$_2$SnS$_3$—ZnS particles produced in Example 6 were dispersed in a mixed solvent containing an alcohol-based solvent to prepare an ink and the ink was coated on a glass substrate coated with molybdenum (Mo). After the coating film was dried, it was heated with a Se-deposited glass substrate to secure a Se atmosphere and rapid thermal annealing (RTA) was conducted at 575° C. to produce a CZTSSe-based thin film. The scanning electron microscope (SEM) image and XRD graph of the produced thin film are shown in FIGS. 13 and 14.

COMPARATIVE Example 4

Production of Thin Film

CuS, SnS and ZnS particles produced in Comparative Examples 1 to 3 were dispersed in a mixed solvent containing an alcohol-based solvent to prepare an ink and the ink was coated on a glass substrate coated with molybdenum (Mo). After the coating film was dried, it was heated with a Se-deposited glass substrate to secure a Se atmosphere and rapid thermal annealing (RTA) was conducted at 575° C. to produce a CZTSSe-based thin film. The scanning electron microscope (SEM) image and XRD graph of the produced thin film are shown in FIGS. 15 and 16.

TEST EXAMPLE 1

Production of Thin Film Solar Cell

The CZTSSe-based thin films produced in Examples 7 to 9 and Comparative Example 4 were etched with a potassium cyanide (KCN) solution, a CdS layer (thickness: 50 nm) was laminated by chemical bath deposition (CBD), a ZnO layer (thickness: 100 nm) and an Al-doped ZnO layer (thickness: 500 nm) were sequentially laminated by sputtering to produce a thin film, and an aluminum (Al) electrode was formed on the thin film to produce a thin film solar cell. The properties obtained from the solar cells are shown in the following Table 1 and FIGS. 17 to 20.

TABLE 1

|  | $J_{sc}$ (mA/cm$^2$) | $V_{oc}$ (V) | FF (%) | Photoelectric efficiency (%) |
|---|---|---|---|---|
| Example 7 | 11.6 | 0.268 | 26.4 | 0.82 |
| Example 8 | 26.8 | 0.290 | 41.3 | 3.2 |
| Example 9 | 3.568 | 0.15 | 28.9 | 0.15 |
| Comparative Example 4 | 1.36 | 0.2 | 24.68 | 0.1 |

$J_{sc}$ which is a parameter determining an efficiency of solar cells shown in Table 1 means current density, $V_{oc}$ means an open circuit voltage measured at zero output current, photoelectric efficiency means a ratio of cell power with respect to an energy amount of light incident upon a solar cell panel, and fill factor (FF) means a value calculated by dividing a value obtained by multiplying current density by voltage at a maximum power point by a value obtained by multiplying $V_{oc}$ by $J_{sc}$.

As a result of testing, it can be seen that solar cells including CZTSSe-based thin films produced in Examples 7 to 9 exhibit superior cell characteristics, as compared to the solar cell including the CZTSSe-based thin film produced in Comparative Example 4.

In addition, the solar cell including the CZTSSe-based thin film produced in Example 8 exhibits superior cell characteristics such as $J_{sc}$, FF and photoelectric efficiency, as compared to the solar cell including the CZTSSe-based thin film produced in Example 9. Among metal chalcogenide nanoparticles according to the present invention, Cu—Sn—Zn composite nanoparticles provide further superior cell characteristics.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As apparent from the fore-going, the metal chalcogenide nanoparticles according to the present invention for producing a light absorption layer of solar cells are produced by heat-treating at least one type of single-source precursor including a Group VI element linked as a ligand to any one metal selected from the group consisting of copper (Cu), zinc (Zn) and tin (Sn), and can be produced only with a single source without incorporating an additional Group VI element source. Accordingly, there is an advantage in terms of economic efficiency of particles and metal chalcogenide nanoparticles having no phase change are synthesized. Thin films produced from such metal chalcogenide nanoparticles can advantageously minimize formation of secondary phases.

In particular, core-shell structured composite nanoparticles have a structure in which a core is protected by a shell including metal-containing chalcogenide, thereby being stable against oxidation, minimizing formation of oxides on particle surfaces and improving reactivity during formation of thin films.

The invention claimed is:

1. A method of preparing metal chalcogenide nanoparticles, the method comprising:
heat-treating at least one type of single-source precursor, wherein the single-source precursor comprises a metal-ligand complex selected from the group consisting of a copper (Cu)-ligand complex, a tin (Sn)-ligand complex and a zinc (Zn)-ligand complex,
wherein the ligand comprises one or more selected from the following:

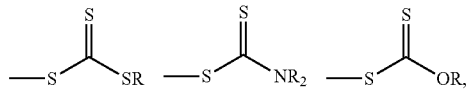

wherein R is a methyl group, an ethyl group or a propyl group.

2. The method according to claim 1, wherein the heat-treatment is carried out at a temperature of 50 to 300° C.

3. A method of preparing metal chalcogenide nanoparticles, the method comprising:
(a) heat-treating a mixture including at least one type of a first single-source precursor, wherein the first single-source precursor comprises a metal-ligand complex selected from the group consisting of a copper (Cu)-ligand complex, a tin (Sn)-ligand complex and a zinc (Zn)-ligand complex, and wherein the ligand comprises one or more selected from the following:

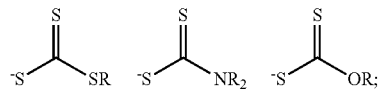

and
(b) adding, to the heat-treated mixture, a mixture including at least one type of a second single-source precursor comprising a metal-ligand complex selected from the group consisting of a copper (Cu)-ligand complex, a tin (Sn)-ligand complex and a zinc (Zn)-ligand complex, wherein the ligand comprises one or more selected from the following:

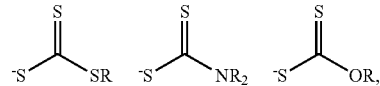

and heat-treating the resulting mixture,
wherein R is a methyl group, an ethyl group or a propyl group, and
wherein the first and second single-source precursors are different.

4. The method according to claim 3, wherein the heat-treatment is carried out at a temperature of 50 to 300° C.

5. The method according to claim 3, further comprising:
after step (b), adding a mixture including at least one type of a third single-source precursor comprising a metal-ligand complex selected from the group consisting of a copper (Cu)-ligand complex, a tin (Sn)-ligand complex and a zinc (Zn)-ligand complex, wherein the ligand comprises one or more selected from the following:

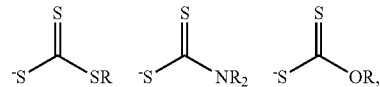

and heat-treating the resulting mixture,
wherein R is a methyl group, an ethyl group or a propyl group, and
wherein the first, second and third single-source precursors are different.

* * * * *